(12) United States Patent
Yasuda et al.

(10) Patent No.: US 10,170,284 B2
(45) Date of Patent: Jan. 1, 2019

(54) PLASMA PROCESSING METHOD AND PLASMA PROCESSING APPARATUS

(71) Applicants: Tokyo Electron Limited, Minato-ku (JP); Kabushiki Kaisha Toshiba, Minato-ku (JP)

(72) Inventors: Kenta Yasuda, Kurokawa-gun (JP); Toru Kubota, Yokkaichi (JP); Takashi Kondo, Kurokawa-gun (JP); Katsuhiro Ishida, Yokkaichi (JP)

(73) Assignees: TOKYO ELECTRON LIMITED, Minato-ku (JP); KABUSHIKI KAISHA TOSHIBA, Minato-ku (JP)

( * ) Notice: Subject to any disclaimer, the term of this patent is extended or adjusted under 35 U.S.C. 154(b) by 0 days.

(21) Appl. No.: 15/264,955

(22) Filed: Sep. 14, 2016

(65) Prior Publication Data
US 2017/0004956 A1  Jan. 5, 2017

Related U.S. Application Data

(63) Continuation of application No. PCT/JP2015/001913, filed on Apr. 6, 2015.

(30) Foreign Application Priority Data

Apr. 9, 2014 (JP) ................................ 2014-080039

(51) Int. Cl.
*H01J 37/32* (2006.01)
*H01L 21/67* (2006.01)
(Continued)

(52) U.S. Cl.
CPC .... *H01J 37/32669* (2013.01); *H01J 37/3244* (2013.01); *H01J 37/3266* (2013.01);
(Continued)

(58) Field of Classification Search
None
See application file for complete search history.

(56) References Cited

U.S. PATENT DOCUMENTS 6,014,979 A * 1/2000 Van Autryve ......... B08B 7/0035
134/1.1
6,095,084 A * 8/2000 Shamouilian ........... C23C 16/00
118/723 E
(Continued)

FOREIGN PATENT DOCUMENTS

JP  2004-303939  10/2004
JP  2007-258417  10/2007
(Continued)

OTHER PUBLICATIONS

International Search Report dated Jun. 23, 2015 in PCT/JP2015/001913, filed Apr. 6, 2015 ( with English Translation).
(Continued)

*Primary Examiner* — Allan Olsen
(74) *Attorney, Agent, or Firm* — Oblon, McClelland, Maier & Neustadt, L.L.P.

(57) ABSTRACT

A plasma processing method according to an aspect includes: preparing a plasma processing apparatus including: a chamber; a lower electrode; an upper electrode; a focus ring surrounding a peripheral edge of the lower electrode; and an annular coil disposed on an upper portion of the upper electrode at a more outer position than the peripheral edge of the lower electrode; placing a substrate on the lower electrode, with a peripheral edge of the substrate surrounded by the focus ring; introducing process gas into the chamber; generating plasma of the process gas by applying high-frequency power across the upper electrode and the lower electrode; and leveling an interface of a plasma sheath on an upper portion of the substrate with that on an upper portion of the focus ring by generating a magnetic field by supplying a current to the annular coil.

2 Claims, 5 Drawing Sheets

(51) Int. Cl.
  *H01L 21/3065* (2006.01)
  *H05H 1/46* (2006.01)
  *H01L 21/311* (2006.01)

(52) U.S. Cl.
  CPC .. *H01J 37/32082* (2013.01); *H01J 37/32532* (2013.01); *H01J 37/32642* (2013.01); *H01J 37/32715* (2013.01); *H01L 21/3065* (2013.01); *H01L 21/31116* (2013.01); *H01L 21/67069* (2013.01); *H05H 1/46* (2013.01); *H01J 2237/334* (2013.01); *H05H 2001/4667* (2013.01)

(56) References Cited

U.S. PATENT DOCUMENTS

| | | | |
|---|---|---|---|
| 6,190,495 B1* | 2/2001 | Kubota | C23F 4/00 118/723 MA |
| 2007/0224709 A1 | 9/2007 | Ogasawara | |
| 2008/0020574 A1* | 1/2008 | Marakhtanov | H01J 37/32091 438/689 |
| 2010/0203736 A1 | 8/2010 | Ichino et al. | |
| 2013/0228550 A1* | 9/2013 | Mori | H01J 37/321 216/61 |
| 2014/0346040 A1 | 11/2014 | Yokota et al. | |

FOREIGN PATENT DOCUMENTS

JP  2010-186841  8/2010
JP  2013-149722  8/2013

OTHER PUBLICATIONS

Written Opinion dated Jun. 23, 2015 in PCT/JP2015/001913, filed Apr. 6, 2015.
English translation of the International Preliminary Report on Patentability and Written Opinion dated Oct. 20, 2016 in PCT/JP2015/001913 filed Apr. 6, 2015.

\* cited by examiner

PLASMA PROCESSING METHOD AND PLASMA PROCESSING APPARATUS

CROSS-REFERENCE TO RELATED APPLICATIONS

This application is a continuation of prior International Application No. PCT/JP2015/001913 filed on Apr. 6, 2015 which is based upon and claims the benefit of priority from Japanese Patent Application No. 2014-080039 filed on Apr. 9, 2014; the entire contents of all of which are incorporated herein by reference.

TECHNICAL FIELD

Embodiments described herein relate generally to a plasma processing method and a plasma processing apparatus.

BACKGROUND ART

A plasma processing apparatus has been used in a semiconductor device manufacturing process for etching a substrate (for example, a semiconductor wafer) with plasmatized gas acting on the substrate. Such a plasma processing apparatus includes a capacitive coupling plasma processing apparatus which has an upper electrode and a lower electrode facing each other in a process chamber and generates plasma by applying high-frequency power across these electrodes. Another plasma processing apparatus has the above-described structure and controls the plasma density with a magnetic field.

The above-described plasma processing apparatus can generate the plasma sheath which has different thicknesses between an area above the substrate and an area above and outside the substrate because a peripheral area and an outside area of the substrate are different in structure and material. The thickness difference in the plasma sheath causes an interface of the plasma sheath (interface between the plasma sheath and the plasma) to have a level difference to have a slanting portion at the boundary between the lower and higher-level portions. Ions are obliquely incident on the slanting portion, resulting in tilting which is a tilting etching state. A measure to flatten the interface of the plasma sheath is to surround the outer periphery of the substrate by a focus ring made of, for example, Si or SiC. Another measure to flatten the interface of the plasma sheath to prevent the tilting is to change the thickness and material of the focus ring or apply a high-frequency bias to the focus ring itself.

SUMMARY

As described above, the plasma processing apparatus has the focus ring surrounds the outside of the substrate to prevent the tilting at the outer peripheral portion of the substrate. In this case, however, a thickness change of the focus ring due to its wear causes the tilting, necessitating frequent replacement of the focus ring. The increased maintenance time decreases production efficiency and increases the production cost.

Embodiments of the present invention were made to cope with the above-described circumstances and provides a plasma processing method and a plasma processing apparatus that achieve higher production efficiency and lower production cost than conventionally.

A plasma processing method according to an aspect includes: preparing a plasma processing apparatus, the plasma processing apparatus including: a chamber; a lower electrode disposed in the chamber; an upper electrode disposed in the chamber and facing the lower electrode; a focus ring disposed in the chamber and surrounding a peripheral edge of the lower electrode; and an annular coil disposed on an upper portion of the upper electrode at a more outer position than the peripheral edge of the lower electrode; placing a substrate on the lower electrode, with a peripheral edge of the substrate surrounded by the focus ring; introducing process gas into the chamber; generating plasma of the process gas by applying high-frequency power across the upper electrode and the lower electrode; and leveling an interface of a plasma sheath on an upper portion of the substrate with the interface of the plasma sheath on an upper portion of the focus ring by generating a magnetic field by supplying a current to the annular coil.

A plasma processing apparatus according to an aspect includes: a chamber; a lower electrode disposed in the chamber to place a substrate on; an upper electrode disposed in the chamber and facing the lower electrode; a focus ring disposed in the chamber and surrounding a peripheral edge of the substrate; an annular coil disposed on an upper portion of the upper electrode at a more outer position than the peripheral edge of the substrate; an introducing part which introduces process gas into the chamber; a high-frequency power source which applies high-frequency power across the upper electrode and the lower electrode to generate plasma of the process gas; and a current source which supplies a current to the annular coil to generate a magnetic field to level an interface of a plasma sheath on an upper portion of the substrate with the interface of the plasma sheath on an upper portion of the focus ring.

Embodiments of the present invention achieve higher production efficiency and lower manufacturing cost than conventionally.

DETAILED DESCRIPTION

Figure 1:
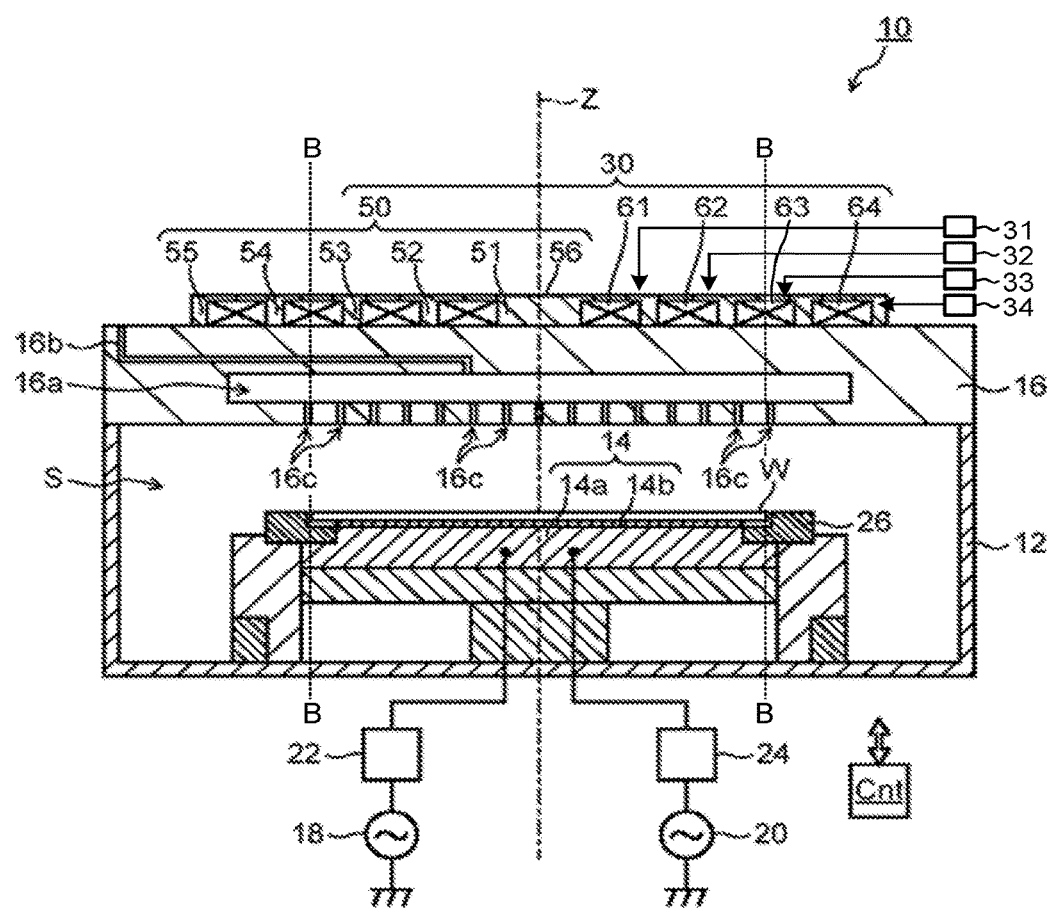
FIG. 1 is a view schematically illustrating the rough structure of a plasma etching apparatus according to an embodiment of the present invention.

An embodiment of the present invention will be hereinafter described with reference to the drawings. FIG. 1 is a view schematically illustrating the rough sectional structure of a plasma processing apparatus according to the embodiment. The plasma processing apparatus 10 illustrated in FIG. 1 includes an airtight cylindrical process chamber 12 for housing a semiconductor wafer W having a diameter of, for example, 300 mm.

A disk-shaped mounting table 14 for placing the semiconductor wafer W is in a lower portion of the process chamber (chamber) 12. The mounting table 14 includes a base 14a (lower electrode) and an electrostatic chuck 14b. The base 14a is a conductive member of, for example, aluminum.

An annular focus ring 26 is on a peripheral edge region of the upper surface of the base 14a to surround the periphery of the semiconductor wafer W. The electrostatic chuck 14b is on a center region of the upper surface of the base 14a. The electrostatic chuck 14b has a disk shape and has an electrode film on an inner side of an insulating film. A DC power source (not illustrated) supplies a DC voltage to the electrode film of the electrostatic chuck 14b to generate an electrostatic force, so that the electrostatic chuck 14b sucks the semiconductor wafer W as a substrate.

The center axis Z passing the center of the semiconductor wafer W mounted on the electrostatic chuck 14b in the up and down direction substantially coincides with the center axes of the base 14a and the electrostatic chuck 14b.

The base 14a serves as the lower electrode. A first high-frequency power source 18 generates high-frequency power for plasma generation and connects with the base 14a via a first matching device 22. The first high-frequency power source 18 generates the high-frequency power with, for example, a 100 MHz frequency. The first matching device 22 has a circuit for matching an output impedance of the first matching device 22 with a load-side (lower electrode-side) input impedance.

In this embodiment, the first high-frequency power source 18 applies the high-frequency power for plasma generation in a pulsed form with a desired frequency (for example, 50 kHz) and a desired duty ratio (for example, 20%). This creates a plasma generation period and a plasma non-generation period to enable to reduce the accumulation of electric charges on a specific portion on the semiconductor wafer W. Specifically, during the plasma generation period, the electric charges accumulate on a portion with a high electron density due to unevenness of the electron density in the plasma, but in the plasma non-generation period, the accumulated electric charges can be dispersed to a surrounding area to eliminate the accumulation of the electric charges. This prevents a breakage of the insulating film.

A second high-frequency power source 20 generates high-frequency bias power for ion attraction and connects with the base 14a via a second matching device 24. The second high-frequency power source 20 generates the high-frequency power having a lower frequency (for example, 3.2 MHz frequency) than that generated by the first high-frequency power source 18. The second matching device 24 has a circuit for matching an output impedance of the second matching device 24 with a load-side (lower electrode-side) input impedance.

An upper electrode 16 is above and faces the mounting table (lower electrode) 14, with a process space S therebetween. The upper electrode 16 has a disk shape and defines the process space S from above. The center axis of the upper electrode 16 substantially coincides with the center axis of the mounting table 14.

The upper electrode 16 also functions as a shower head which introduces predetermined process gas in a shower form into the process space S (an introducing part which introduces process gas into the chamber). In this embodiment, the upper electrode 16 has a buffer chamber 16a, a gas line 16b, and a plurality of gas holes 16c. One end of the gas line 16b connects with the buffer chamber 16a. The gas holes 16c connect with the buffer chamber 16a and extend downward to open toward the process space S. In this embodiment, the upper electrode 16 and the shower head (introducing part) are integrated, but they may be separate structures.

An exhaust mechanism (not illustrated) such as Turbo Molecular Pump (TMP) or Dry Pump (DP) connects with the bottom of the process chamber 12 and keeps the inside of the process chamber 12 at a pressure-reduced atmosphere.

An electromagnet 30 is on an upper portion of the upper electrode 16. The electromagnet 30 includes a core member 50 and coils (annular coils) 61 to 64. The core member 50 includes a pillar-shaped portion 51, a plurality of cylindrical portions 52 to 55, and a base portion 56 which are integrally formed. The electromagnet 30 is made of a magnetic material. The base portion 56 has a substantially disk shape, and its center axis coincides with the center axis Z. The pillar-shaped portion 51 and the cylindrical portions 52 to 55 protrude downward from the lower surface of the base portion 56. The pillar-shaped portion 51 has a substantially columnar shape and its center axis coincides with the center axis Z. The pillar-shaped portion 51 has a radius L1 (refer to FIG. 2) of, for example, 30 mm.

Figure 2:
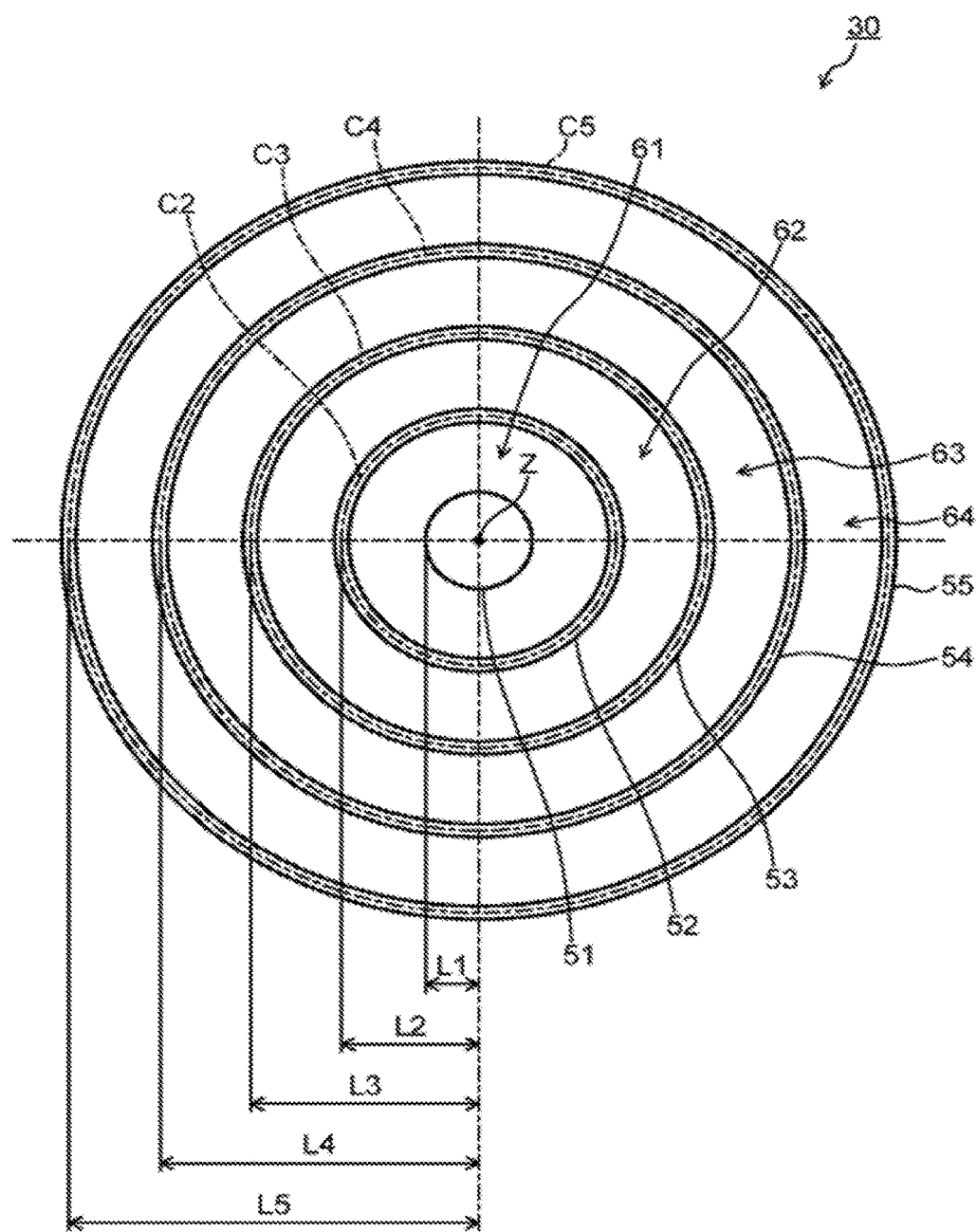
FIG. 2 is a view schematically illustrating the rough structure of an essential part of the plasma etching apparatus.

The cylindrical portions 52 to 55 each have a cylindrical shape extending in the axis Z direction. As illustrated in FIG. 2, the cylindrical portions 52 to 55 are respectively along a plurality of concentric circles C2 to C5 whose centers are the center axis Z. Specifically, the cylindrical portion 52 is along the concentric circle C2 with a radius L2 larger than the radius L1. The cylindrical portion 53 is along the concentric circle C3 with a radius L3 larger than the radius L2. The cylindrical portion 54 is along the concentric circle C4 with a radius L4 larger than the radius L3. The cylindrical portion 55 is along the concentric circle C5 with a radius L5 larger than the radius L4.

For example, the radii L2, L3, L4, L5 are 76 mm, 127 mm, 178 mm, and 229 mm respectively. The middle circumferences of the coils 61, 62, 63, 64 are distant from the center axis Z by about 50 mm, 100 mm, 150 mm, and 200 mm respectively.

A groove is between the pillar-shaped portion 51 and the cylindrical portion 52. As illustrated in FIG. 1, this groove houses the coil 61 wound along the outer peripheral surface of the pillar-shaped portion 51. A groove is also between the cylindrical portion 52 and the cylindrical portion 53 to house the coil 62 wound along the outer peripheral surface of the cylindrical portion 52. A groove is also between the cylindrical portion 53 and the cylindrical portion 54 to house the coil 63 wound along the outer peripheral surface of the cylindrical portion 53. A groove is also between the cylindrical portion 54 and the cylindrical portion 55 to house the coil 64 wound along the outer peripheral surface of the cylindrical portion 54. Both ends of the coils 61 to 64 connect with power sources (current sources) 31 to 34. A controller Cnt controls current supply and stop of the current supply to the coils 61 to 64 from the power sources 31 to 34 and values of the currents by its control signals.

In the electromagnet 30, the radii L4, L5 are larger than the 150 mm radius of the semiconductor wafer W, as described above. Accordingly, as illustrated in FIG. 1, the coil 64 is on a more outer side than the outer peripheral edge of the semiconductor wafer W, with at least part thereof being above the focus ring 26. The coils 61, 62 are above the semiconductor wafer W, in particular, on a more inner side than the outer peripheral edge of the semiconductor wafer W. The coil 63 spans a region from an inner side to an outer side of the outer peripheral edge of the semiconductor wafer W.

The boundary B illustrated in FIG. 1 demarcates the inner side and the outer side of the outer peripheral edge of the semiconductor wafer W. The boundary B is along the peripheral edge of the semiconductor wafer W and has a substantially cylindrical plane shape having rotational symmetry with respect to the center axis Z.

Figure 3:
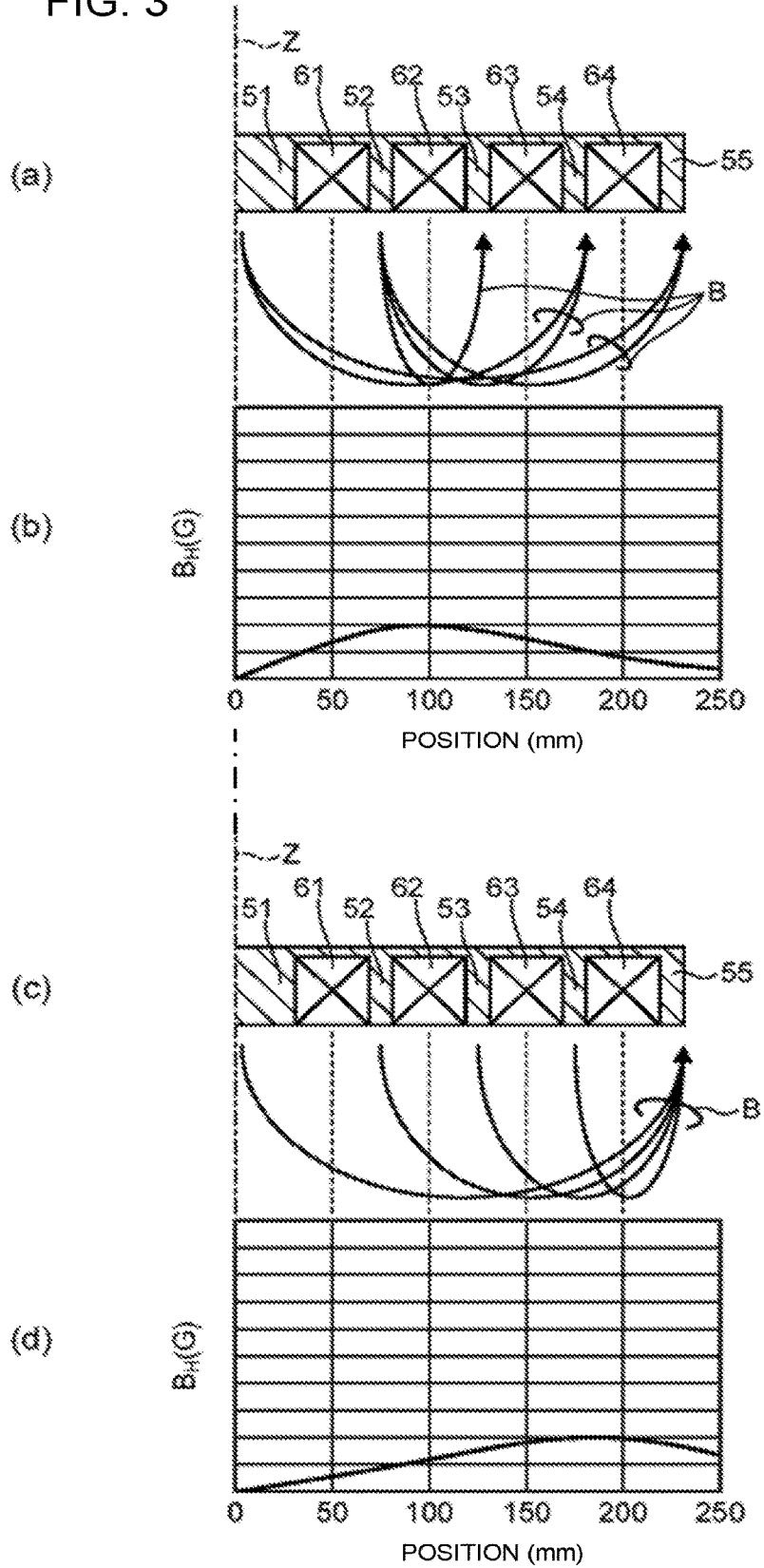
FIG. 3 are charts illustrating examples of a magnetic field formed by an electromagnet.

The electromagnet 30 as structured above is capable of forming a magnetic field B in the process space S when one or more coils out of the coils 61 to 64 are supplied with the current from the power sources 31 to 34. The magnetic field B has horizontal magnetic field components BH along the radial direction from the center axis Z. FIG. 3 illustrate examples of the magnetic field formed by the electromagnet 30.

FIG. 3(a) illustrates a cross section of the electromagnet 30 in a half plane with respect to the center axis Z and the magnetic field B when the current is supplied to the coil 62. FIG. 3(b) illustrates intensity distribution of the horizontal magnetic field components BH when the current is supplied to the coil 62.

FIG. 3(c) illustrates the cross section of the electromagnet 30 in the half plane with respect to the center axis Z and the magnetic field B when the current is supplied to the coil 64. FIG. 3(d) illustrates intensity distribution of the horizontal magnetic field components BH when the current is supplied to the coil 64. In the graphs illustrated in FIG. 3(b) and FIG. 3(d), the horizontal axis represents the radial-direction position from the center axis Z whose position is 0 mm, and the vertical axis represents the intensity (magnetic flux density) of the horizontal magnetic field components BH (horizontal components of the magnetic field).

The supply of the current to the coil 62 of the electromagnet 30 results in the formation of the magnetic field B illustrated in FIG. 3(a). Specifically, the formed magnetic field B extends from process space S-side end portions of the pillar-shaped portion 51 and the cylindrical portion 52 toward process space S-side end portions of the cylindrical portions 53 to 55. The radial-direction intensity distribution of the horizontal magnetic field components BH of such a magnetic field B has a peak under the middle circumference of the coil 62 as illustrated in FIG. 3(b). For example, the position of the middle circumference of the coil 62 is about 100 mm distant from the axis Z, and when the wafer W with a 300 mm diameter is processed, this position is a radial-direction middle position between the center and the edge of the wafer W.

The supply of the current to the coil 64 of the electromagnet 30 results in the formation of the magnetic field B illustrated in FIG. 3(c). Specifically, the formed magnetic field B extends from process space S-side end portions of the pillar-shaped portion 51 and the cylindrical portions 52 to 54 toward a process spaces S-side end portion of the cylindrical portion 55. The radial-direction intensity distribution of the horizontal magnetic field components BH of such a magnetic field B has a peak under the middle circumference of the coil 64 as illustrated in FIG. 3(d). For example, the position of the middle circumference of the coil 64 is about 200 mm distant from the axis Z, and when the wafer W with a 300 mm diameter (150 mm radius) is processed, this position is radially on an outer side of the edge (boundary B) of the wafer W, that is, is the position of the focus ring 26.

In the plasma processing apparatus 10, the process gas from a gas supply system is supplied to the process space S through the upper electrode 16 constituting the shower head and the high-frequency power from the first high-frequency power source 18 is supplied to the mounting table 14 as the lower electrode, whereby the high-frequency electric field is generated between the upper electrode 16 and the mounting table 14. This causes the generation of the plasma of the process gas in the process space S. Then, the semiconductor wafer W can be processed by active species of molecules or atoms of the process gas dissociated in the plasma. Further, adjusting the high-frequency bias power to be supplied to the mounting table 14 as the lower electrode from the second high-frequency power source 20 enables the adjustment of an ion attraction degree.

The plasma processing apparatus 10 includes the controller Cnt. The controller Cnt includes a programmable computer device (a processor, a memory, an input device, and a display). The controller Cnt controls the high-frequency power to be generated by the first high-frequency power source 18, the high-frequency power to be generated by the second high-frequency power source 20, an exhaust amount of the exhaust device, the gas to be supplied from the gas supply system, a flow rate of the gas, and values and directions of the currents to be supplied from the power sources 31 to 34 to the coils 61 to 64 of the electromagnet 30. For this purpose, the controller Cnt sends the control signals to the first high-frequency power source 18, the second high-frequency power source 20, the exhaust device, constituent elements of the gas supply system, and the power sources 31 to 34 (the current sources connecting with the electromagnet 30), in accordance with recipes (stored in the memory or input from the input device).

In this embodiment, at the time of the plasma processing, the power source 34 supplies the current to the coil 64 to generate the magnetic field under the control by the controller Cnt. As a result, the interface of the plasma sheath (interface between the plasma sheath and the plasma) above the semiconductor wafer W is leveled with the interface above the focus ring 26 so that the interface of the plasma sheath has a flat plane horizontal to the surface of the semiconductor wafer W.

The plasma processing apparatus 10 has the focus ring 26 surrounding the periphery of the semiconductor wafer W, thus the state of the plasma on the outer periphery of the semiconductor wafer W becomes uniform with that on the upper portion of the semiconductor wafer W, resulting in more uniform processing in the surface of the semiconductor wafer W. However, if the interface of the plasma sheath has a level difference between its portions above the semiconductor wafer W and above the focus ring 26, an angle of incidence of the ions becomes oblique at a slanting portion of the interface of the plasma sheath, causing tilting which is a tilting etching state.

Figure 4:
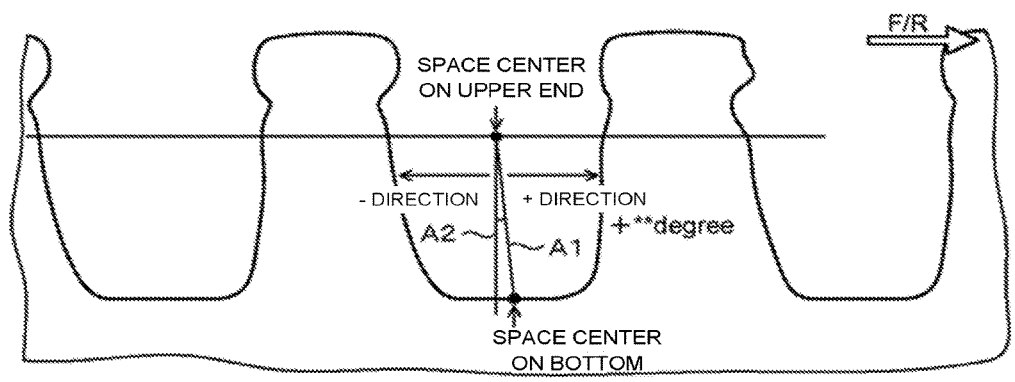
FIG. 4 is an explanatory view of a generation state of tilting.

FIG. 4 schematically illustrates an example of an enlarged cross section along the radial direction when holes and line shapes are formed in the semiconductor wafer W by plasma etching. In FIG. 4, the left side is a center direction of the semiconductor wafer W and the right side is a direction of the focus ring (peripheral edge of the semiconductor wafer W).

As illustrated in FIG. 4, when the holes and the line shapes are formed by the plasma etching, the oblique incidence of the ions on the semiconductor wafer W makes the etching state tilted relatively to the semiconductor wafer W. This results in the radial-direction deviation between the center position of a space on an upper end of the formed hole or line (space center on the upper end) and the center position of the space on its bottom (space center on the bottom), so that the line A1 connecting these centers tilts relatively to the vertical line A2 extending down from the space center on the upper end.

This is the tilting occurrence state, and the tilting occurrence state can be quantitatively evaluated based on the measurement of an angle made by the line A1 and the vertical line A2 (hereinafter, a tilt angle). Such tilting is a problem in the progress of miniaturization and the progress of multilayering in, for example, a three-dimensional NAND. The tilt angle is preferably less than about ±1.0°.

Figure 5:
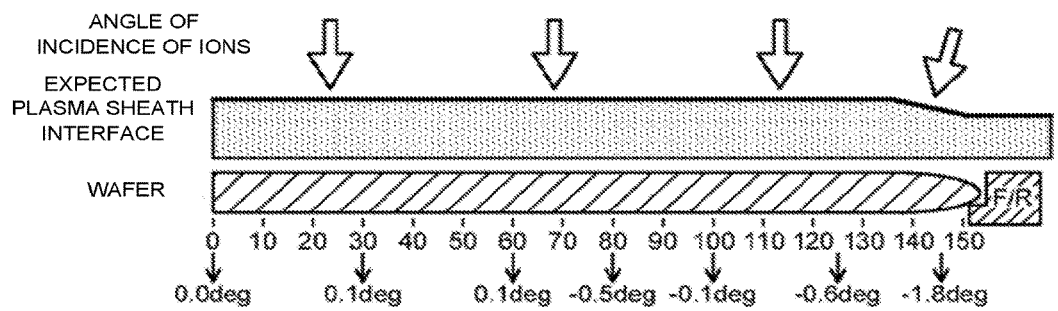
FIG. 5 is a view schematically illustrating a relation of a tilt angle, the shape of an interface of a plasma sheath, and an incident direction of ions.

FIG. 5 schematically illustrates a relation of the aforesaid tilt angle, the shape of the interface of the plasma sheath, and an incident direction of ions. FIG. 5 shows results of the measurement of the tilt angle at the positions 0 mm, 30 mm, 60 mm, 80 mm, 100 m, 125 mm, and 145 mm distant from the center of the semiconductor wafer W when the current is supplied to the coil 64 to form a 15 G magnetic field. The tilt angles at these positions are 0.0, 0.1, 0.1, −0.5, −0.1, −0.6, and −1.8 degrees (deg) respectively. FIG. 5 illustrates, in its upper part, the shape of the sheath interface expected in this case and the angle of incidence of the ions.

As illustrated in FIG. 5, the supply of the current to the coil 64 to form the magnetic field makes it possible to control the shape of the interface of the plasma sheath. In this case, at the portion where the magnetic field is formed, electrons stay long to increase the plasma density. Consequently, the plasma sheath becomes thin and the position of the interface of the plasma sheath becomes low. Further, if the interface of the plasma sheath has the level difference, the angle of incidence of the ions (indicated by the arrow in FIG. 5) becomes oblique at a slanting portion of the interface of the plasma sheath and the tilting occurs at this portion.

As is seen from the results illustrated in FIG. 5, in the absence of the magnetic field, the interface of the plasma sheath on the center portion of the semiconductor wafer W is normally a flat surface parallel to the surface of the semiconductor wafer W. This highly possibly causes the interface of the plasma sheath to have the level difference on the peripheral edge portion of the semiconductor wafer W. That is, a difference in material and structure between the semiconductor wafer and the structure therearound affects the state of the plasma formed on their upper portions, which is likely to cause the level difference in the interface of the plasma sheath. To reduce such a phenomenon, the focus ring 26 surrounds the semiconductor wafer W. A thickness change of the focus ring 26 due to its wear, however, also causes a height change of the interface of the plasma sheath on the upper portion of the focus ring 26.

As a countermeasure, as illustrated in FIG. 5, the magnetic field is formed by the current supply only to the coil 64 located on a more outer side than the outer periphery of the semiconductor wafer W with its part being above the focus ring 26. This as a result can change the thickness of the plasma sheath, in particular on the upper portion of the focus ring 26 to change the height of the interface of the plasma sheath.

In this case, as illustrated in FIG. 3($d$), the radial-direction intensity distribution of the horizontal magnetic field components BH of the magnetic field formed by the supply of the current only to the coil 64 has the peak (highest value) under the middle circumference of the coil 64 (on the more outer side than the peripheral edge (boundary B) of the semiconductor wafer W).

In this embodiment, the supply of the current only to the coil 64 to form the magnetic field makes it possible to reduce the occurrence of the tilting at the peripheral edge portion of the semiconductor wafer W.

Further, the thickness change of the focus ring 26 due to its wear changes the state of the plasma on the focus ring 26, leading to the height change of the interface of the plasma sheath. To prevent this, this embodiment varies the intensity of the magnetic field by adjusting the current that is to be supplied to the coil 64. As a result, even if the focus ring 26 wears away, it is possible to flatten the interface of the plasma sheath into a plane parallel to the surface of the semiconductor wafer W to reduce the occurrence of the tilting.

Figure 6:
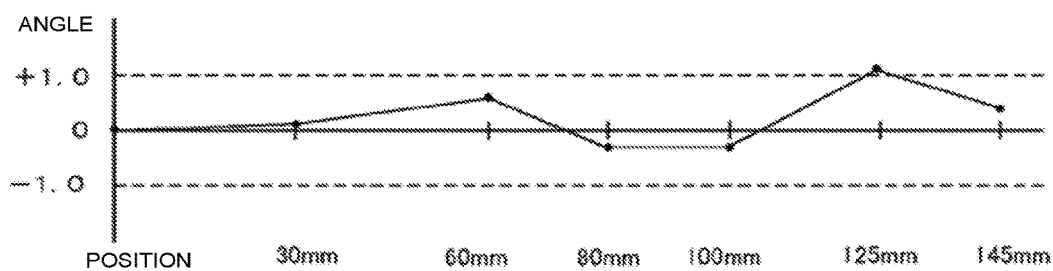
FIG. 6 is a chart illustrating measurement values of the tilt angle when a 1 G magnetic field is generated.
Figure 7:
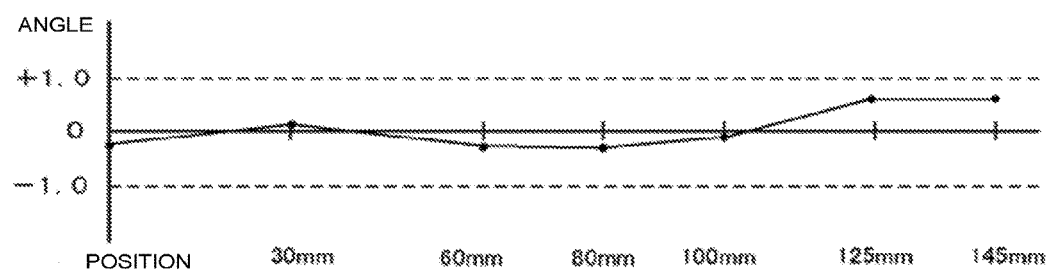
FIG. 7 is a chart illustrating measurement values of the tilt angle when an 8 G magnetic field is generated.
Figure 8:
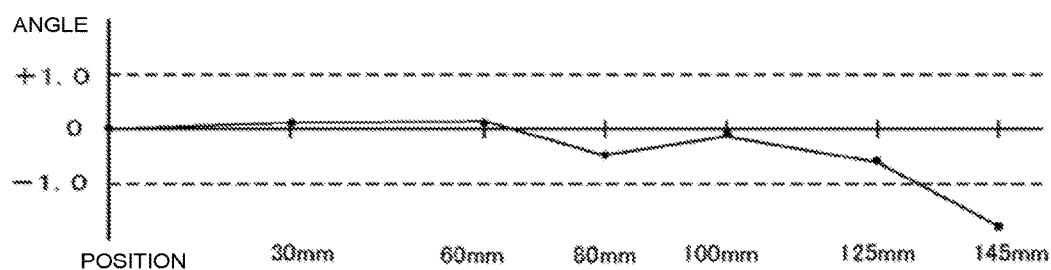
FIG. 8 is a chart illustrating measurement values of the tilt angle when a 15 G magnetic field is generated.

FIG. 6 to FIG. 8 illustrate results when a layer to be etched of the semiconductor wafer W is plasma-etched while the current is supplied only to the coil 64 to form the magnetic field. Specifically, the tilt angle of a pattern formed by the etching is measured at the positions 0 mm, 30 mm, 60 mm, 80 mm, 100 mm, 125 mm, and 145 mm distant from the center of the semiconductor wafer W. FIG. 6 illustrates the result when a 1 G magnetic field is formed. FIG. 7 illustrates the result when an 8 G magnetic field is formed. FIG. 8 illustrates the result when a 15 G magnetic field is formed.

In the plasma etching, gas containing "$C_4F_8+C_4F_6+Ar+O_2$" was used as the process gas, and its condition was as follows, for instance.

pressure inside the process chamber: 5.32 Pa (40 mTorr)
first high-frequency: 100 MHz frequency, 300 W
second high-frequency: 3.2 MHz frequency, 10000 W
processing time: one minute The plasma etching condition is not limited to the above, and the pressure can be set to 1.33 to 5.32 Pa (10 to 40 mTorr) by selecting the flow rates of the process gas from values within the following ranges: $C_4F_8+C_4F_6$=10 to 300 sccm, Ar=50 to 800 sccm, and $O_2$=5 to 150 sccm.

As illustrated in FIG. 6, when the current is supplied to the coil 64 to form the 1 G magnetic field, the tilt angle at the 125 mm position from the center of the semiconductor wafer W is +1.1°, and thus there is a portion where the tilt angle is 1.0° or more.

As illustrated in FIG. 7, when the current is supplied to the coil 64 to form the 8 G magnetic field, the tilt angles at all the positions are less than ±1.0°, and thus there is no portion where the tilt angle is 1.0° or more.

As illustrated in FIG. 8, when the current is supplied to the coil 64 to form the 15 G magnetic field, the tilt angle at the 145 mm position from the center of the semiconductor wafer W is −1.8°, and thus there is a portion where the tilt angle is 1.0° or more.

As is seen from the above FIG. 6 to FIG. 8, the state of the tilting at the peripheral edge portion of the semiconductor wafer W can be controlled by supplying the current only to the coil 64 located on a more outer side than the peripheral edge (boundary B) of the semiconductor wafer W to form the magnetic field and by varying the magnitude of the current to adjust the intensity of the magnetic field. As a result, the tilt angle at each portion has a favorable value of less than +1.0°.

The results illustrated in FIG. 6 show that the tilt angles at the 125 mm position and the 145 position from the center of the semiconductor wafer W are +1.1° and +0.6° respectively. The results illustrated in FIG. 8 show that the tilt angles at the 125 mm position and the 145 mm position from the center of the semiconductor wafer W are −0.6° and −1.8° respectively. At this time, an increase in the intensity of the magnetic field can reduce the thickness of the plasma sheath to lower the height of the interface of the plasma sheath. This causes to invert the angle of incidence of the ions to change the tilt angle from a plus direction to a minus direction.

In the above, the current is supplied only to the coil 64, but the current can be supplied to at least one (or all) of the coils 61 to 63 in addition to the coil 64. By supplying the current to at least one of the coils 61 to 63 and to the coil 64 and adjusting the current to be supplied to the coil 64, it is possible to control the tilting state near the peripheral edge of the semiconductor wafer W. It is only necessary at this time that the magnetic fields from the coils 61 to 63 do not impair the thickness uniformity of the plasma sheath. This is possible by, for example, making the magnetic fields from the coils 61 to 63 smaller than the magnetic field from the coil 64.

The thickness reduction of the focus ring 26 due to its wear causes the interface of the plasma sheath formed on the upper portion of the focus ring 26 to undergo a height change to cause the level difference in the interface of the plasma sheath, resulting in the tilting. To cope with this, the replacement of the focus ring 26 has conventionally been required.

In this embodiment, on the other hand, by controlling the intensity of the magnetic field by adjusting the current to be supplied to the coil 64 according to the worn state of the focus ring 26, the interface of the plasma sheath can keep flat to reduce the occurrence of the tilting. This enables to put off the replacement time of the focus ring 26, increase the life of the focus ring 26, and elongate the maintenance cycle, enabling an improvement of productivity and a reduction of the manufacturing cost.

The present invention is not limited to the embodiments and the examples described above, and various modifications can of course be made therein,

What is claimed is:

1. A plasma processing method comprising:
    preparing a plasma processing apparatus, the plasma processing apparatus comprising:
        a chamber;
        a lower electrode disposed in the chamber;
        an upper electrode disposed in the chamber and facing the lower electrode;
        a focus ring disposed in the chamber and surrounding a peripheral edge of the lower electrode; and
        a plurality of annular coils disposed on an upper portion of the upper electrode and being concentric with a substrate to be placed on the lower electrode, one of the annular coils being disposed outside the peripheral edge of the lower electrode, the others of the annular coils being disposed inside the peripheral edge of the lower electrode;
    placing the substrate on the lower electrode, with a peripheral edge of the substrate surrounded by the focus ring;
    introducing process gas into the chamber;
    applying high-frequency power across the upper electrode and the lower electrode to generate plasma of the process gas;
    generating a magnetic field by supplying a current only to the one of the annular coils to level an interface of a plasma sheath on an upper portion of the substrate with the interface of the plasma sheath on an upper portion of the focus ring for reducing the occurrence of tilting in a pattern formed on the substrate by etching with the plasma, wherein a horizontal component of the magnetic field generated from the one of the annular coils has the highest value outside the peripheral edge of the substrate; and
    varying the current to be supplied to the one of the annular coils according to a worn state of the focus ring.

2. The plasma processing method according to claim 1, wherein the step of supplying a current includes supplying a direct current to the one of the annular coils to generate a magnetic field substantially without electric field.

* * * * *